(12) United States Patent
Yoshioka et al.

(10) Patent No.: US 7,995,022 B2
(45) Date of Patent: Aug. 9, 2011

(54) DIGITAL-TO-ANALOG CONVERTER AND IMAGE DISPLAY DEVICE

(75) Inventors: Masaki Yoshioka, Kanagawa (JP); Motoyasu Yano, Kanagawa (JP)

(73) Assignee: Sony Corporation, Tokyo (JP)

( * ) Notice: Subject to any disclaimer, the term of this patent is extended or adjusted under 35 U.S.C. 154(b) by 1009 days.

(21) Appl. No.: 11/889,563

(22) Filed: Aug. 14, 2007

(65) Prior Publication Data
US 2008/0048935 A1 Feb. 28, 2008

(30) Foreign Application Priority Data

Aug. 24, 2006 (JP) ................. 2006-227713

(51) Int. Cl.
G09G 3/36 (2006.01)
G09G 3/20 (2006.01)
G09G 5/10 (2006.01)
H03M 1/66 (2006.01)
(52) U.S. Cl. ............. 345/89; 345/690; 345/55; 341/144
(58) Field of Classification Search ............ 345/89, 345/690; 341/144
See application file for complete search history.

(56) References Cited

U.S. PATENT DOCUMENTS

| | | | | |
|---|---|---|---|---|
| 6,778,120 B2* | 8/2004 | Matsui | .......................... | 341/145 |
| 6,909,414 B2* | 6/2005 | Tsuchi et al. | ................... | 345/89 |
| 7,855,720 B2* | 12/2010 | Yoshioka et al. | ............. | 345/210 |
| 2006/0232459 A1* | 10/2006 | Dempsey et al. | ............. | 341/144 |
| 2007/0171113 A1* | 7/2007 | Lan | ............................... | 341/144 |

FOREIGN PATENT DOCUMENTS

JP 2003-224477 8/2003

* cited by examiner

*Primary Examiner* — Kevin M Nguyen
*Assistant Examiner* — Andre Matthews
(74) *Attorney, Agent, or Firm* — Rader Fishman & Grauer PLLC

(57) ABSTRACT

Disclosed herein are a digital-to-analog converter and a video display device. The digital-to-analog converter includes a converting section. The converting section has a code converting section, a reference voltage generating section, a plurality of transistors, and a plurality of gate electrodes. The video display device includes: a pixel section; a plurality of signal lines; one resistor string; and a plurality of converting sections.

11 Claims, 12 Drawing Sheets

| INPUT BITS | | SELECTED SWITCHES |
|---|---|---|
| 1 1 1 1 | → | S0t, S1b |
| 1 1 1 0 | → | S1t, S2b |
| 1 1 0 1 | → | S2t, S3b |
| ⋮ | | ⋮ |
| | | Sit, S(i+1)b |
| | | ⋮ |

| INPUT BITS | | SELECTED SWITCHES |
|---|---|---|
| 1 1 1 1 | → | S0t, S1b |
| 1 1 1 0 | → | S2t, S1b |
| 1 1 0 1 | → | S2t, S3b |
| ⋮ | | ⋮ |

|   B   |   G   |
|-------|-------|
| 0 0 0 | 0 0 0 |
| 0 0 1 | 0 0 1 |
| 0 1 0 | 0 1 1 |
| 0 1 1 | 0 1 0 |
| 1 0 0 | 1 1 0 |
| 1 0 1 | 1 1 1 |
| 1 1 0 | 1 0 1 |
| 1 1 1 | (1 0 0) --→ G UNIT CODE |

DIGITS  B2 B1 B0 | G2 G1 G0

DIGITAL-TO-ANALOG CONVERTER AND IMAGE DISPLAY DEVICE

CROSS REFERENCES TO RELATED APPLICATIONS

The present invention contains subject matter related to Japanese Patent Application JP 2006-227713, filed in the Japan Patent Office on Aug. 24, 2006, the entire contents of which being incorporated herein by reference.

BACKGROUND OF THE INVENTION

1. Field of the Invention

The present invention relates to a digital-to-analog converter for converting an input digital signal into an analog signal, and an image display device having the converter for each signal line for driving a pixel portion.

2. Description of the Related Art

FIG. 1 shows a basic structure of a resistor string type D/A converter.

A resistor string RS including a series connection body of a plurality of N resistor elements RE0, RE1, ..., RE($2^N$−2), and RE($2^N$−1) is connected between an input terminal Tb for a minimum voltage (analog lower limit value) Vb of an analog voltage to be outputted and an input terminal Tt for a maximum voltage (analog upper limit value) Vt of the analog voltage.

Switches are connected to nodes between the resistor elements and a connection node between a resistor element at an end and the input terminal Tb or the input terminal Tt (a connection node on the input terminal Tt side in this case), respectively. In the example of FIG. 1, a switch S0 is connected to the connection node between the resistor elements RE0 and RE1. Likewise, a switch S1 is connected to the connection node between the resistor elements RE1 and RE2. This connection relationship is repeated for other switches S3 to S($2^N$−1) while the resistor elements are shifted one by one.

The N switches S0 to S($2^N$−1) are short-circuited on a side opposite from the resistor elements and are connected to an output terminal To.

When the D/A converter selects one switch according to a digital signal of N bits inputted to the D/A converter, a desired analog D.C. voltage resulting from equally dividing (Vt−Vb) by $2^N$ is obtained as an output voltage Vo from the output terminal To.

When the number of bits is N, the number of necessary analog switches (switches) is $2^N$ in the D/A converter of this configuration. Thus, the D/A converter of this configuration is disadvantageous in that in the case of conversion of multiple bits, the number of switches becomes enormous.

A D/A converter having a configuration of a plurality of stages in which converter the number of switches can be reduced is known (see Patent Document 1, for example).

Patent Document 1 discloses a two-stage configuration including a first-stage D/A converter for converting m higher order bits and a next-stage D/A converter for converting n lower order bits. The first-stage D/A converter is of a resistor string type. Two examples of switch connection configuration of the first-stage D/A converter are disclosed. The switch connection configurations will be described below.

FIG. 2A is a circuit diagram of a higher order D/A converter. Incidentally, in this diagram, the order in which numbers of resistor elements RE and switches are arranged is the reverse of that of FIG. 1.

The D/A converter shown in FIG. 2A has two switches Sit and Sib (i=1, 2, 3, 4, ...) connected in parallel with each other to a node between resistor elements RE in a resistor string RS similar to that of FIG. 1. Outputs of a switch Sit group including half of the switches are connected to a common output terminal Tot. Outputs of a switch Sib group including the other half of the switches are connected to a common output terminal Tob.

FIG. 2B shows correspondences between switches selected and turned on in a pair and input bits in a case where the number of input bits is four. As indicated by the correspondences, two switches are always selected as switches at both ends of a resistor element RE. Hence, voltages Vtt and Vbb at both ends of one resistor element REi (i=1, 2, 3, 4, ...) identified by a code of higher order bits of an input digital signal are outputted from the two output terminals Tot and Tob. While the values of the voltages Vtt and Vbb differ depending on which resistor element RE is selected, the voltages Vtt and Vbb have a fixed voltage difference and serve as reference voltages for the lower order D/A converter.

For example, when the switches S3t and S4b are selected and turned on, voltages at both ends of the resistance RE3 are supplied to the lower order D/A converter.

When the lower order D/A converter is of a resistor string type, the two selected voltages are applied to both ends of a lower order resistor string RS, and lower order D/A conversion is similarly performed. This lower order D/A converter is realized with the same configuration as in FIG. 1 to provide one analog output. Incidentally, in Patent Document 1, the lower order D/A converter is of an R-2R ladder resistor type.

When the configuration shown in FIG. 2A is used for N higher order bits, and the configuration shown in FIG. 1 is used for M lower order bits, the total number of switches is a number obtained by adding the number of higher order switches ($2 \times 2^N$−2) to the number of lower order switches ($2^M$).

The total number of switches in FIG. 2A is reduced as compared with the number of switches at the time of the one-stage configuration in FIG. 1, that is, $2^{(N+M)}$, but a switch reduction rate is low because two switches are connected to a node between resistor elements RE.

A configuration in which the number of switches is further reduced is disclosed in Patent Document 1.

FIG. 3A is a circuit diagram of a higher order D/A converter of this configuration.

While two switches are connected to a node between resistor elements RE in FIG. 2A, one switch is connected to a node between resistor elements RE in FIG. 3A. Thus the number of switches is halved. Switches S0t, S1b, S2t, S3b, ... are alternately connected to output terminals Tot and Tob.

FIG. 3B shows correspondences between switches selected and turned on in a pair and input bits in a case where the number of input bits is four.

As indicated by the correspondences, as in the case of FIG. 2B, two switches are always selected as switches at both ends of a resistor element RE. In this case, however, identical switches are each selected twice.

In the D/A converter illustrated in FIG. 3A, the number of switches can be further reduced as compared with the D/A converter illustrated in FIG. 2A.

[Patent Document 1]

Japanese Patent Laid-Open No. 2003-224477 (description of related art, FIG. 10, FIG. 11, FIG. 13 and the like)

SUMMARY OF THE INVENTION

With this configuration, however, control signals for turning on or off switches S0t, S1b, S2t, S3b, ... as required differ from one switch to another. That is, directing attention to a certain switch, there are two combinations for turning on this switch, as described above. Thus, there are two logic combinations of control signals for turning on another switch simultaneously when a control signal is applied to the certain switch.

Hence, a decoder for generating control signals for turning on and off the switches from an input digital signal is required, and pieces of wiring for connection from the decoder to the switches, the pieces of wiring being equal in number to the number of switches, are required. Thus, even though the number of switches can be reduced, the area occupied by the decoder and the wiring leads to a large area of the D/A converter.

It is desirable to provide a D/A converter that has a small number of switches and occupies a small area as a whole, and a video display device including the D/A converter.

According to an embodiment of the present invention, there is provided a digital-to-analog converter including a converting section for converting all or a part of a bit width other than a bit width on a lowest order side included in a total bit width of an input digital signal into an analog value. The converting section includes a code converting section for converting a code of the digital signal into a predetermined code (for example Gray code) of a sequence in which a bit change between successive unit codes occurs at one digit position, and outputting the predetermined code from a plurality of control lines. The converting section further includes a reference voltage generating section for generating a plurality of reference voltages, a plurality of transistors disposed for the reference voltages, respectively, the plurality of transistors controlling output of the corresponding reference voltages, and a plurality of gate electrodes disposed for each of channels of the plurality of transistors, each gate electrode performing control to turn on and off a local channel. The sequence of the predetermined code is programmed in the plurality of transistors by combinations of connections and disconnections between the gate electrodes and the control lines. In each of the plurality of transistors or each of the transistors excluding one or both of two transistors outputting a maximum reference voltage and a minimum reference voltage among the plurality of transistors, a gate electrode is omitted at a part corresponding to a digit where a bit change occurs between a unit code corresponding to the transistor and an adjacent unit code on one of an upper side and a lower side.

According to an embodiment of the present invention, there is provided another digital-to-analog converter including: a converting section for converting all or a part of a bit width other than a bit width on a lowest order side included in a total bit width of an input digital signal into an analog value. The converting section includes a code converting section for converting a code of the digital signal into a predetermined code (for example Gray code) of a sequence in which a bit change between successive unit codes occurs at one digit position, and outputting each unit code of the predetermined code in parallel from a plurality of control lines provided as pairs of positive logic lines and negative logic lines. The converting section further includes a reference voltage generating section for generating a plurality of reference voltages, a plurality of transistors disposed for the reference voltages, respectively, the plurality of transistors controlling output of the corresponding reference voltages, and a plurality of gate electrodes disposed for each of channels of the plurality of transistors, each gate electrode performing control to turn on and off a local channel. The sequence of the predetermined code is programmed in the plurality of transistors by combinations of connections of the gate electrodes to positive logic sides and negative logic sides of control line pairs. In each of the plurality of transistors or each of the transistors excluding one or both of two transistors outputting a maximum reference voltage and a minimum reference voltage among the plurality of transistors, a gate electrode at a part corresponding to a digit where a bit change occurs between a unit code corresponding to the transistor and an adjacent unit code on one of an upper side and a lower side is connected to a voltage supplying line for turning on a local channel corresponding to the gate electrode at all times and is disconnected from both a positive logic control line and a negative logic control line.

According to an embodiment of the present invention, there is provided another digital-to-analog converter including a converting section for converting all or a part of a bit width other than a bit width on a lowest order side included in a total bit width of an input digital signal into an analog value. The converting section includes a code converting section for converting a code of the digital signal into a predetermined code (for example Gray code) of a sequence in which a bit change between successive unit codes occurs at one digit position, and outputting each unit code of the predetermined code in parallel from a plurality of control lines. The converting section further includes a reference voltage generating section for generating a plurality of reference voltages, a plurality of transistors disposed for the reference voltages, respectively, the plurality of transistors controlling output of the corresponding reference voltages, and a plurality of gate electrodes disposed for each of channels of the plurality of transistors, each gate electrode performing control to turn on and off a local channel. The sequence of the predetermined code is programmed in the plurality of transistors by combinations of connections and disconnections between the gate electrodes and the control lines, and as an exception of the programming, a part of the transistor corresponding to a bit change position within a digit code inputted to each of the control lines is formed such that the local channel in the part of the transistor is on irrespective of a logical value indicated by the digit code.

According to an embodiment of the present invention, there is provided a video display device including: a pixel section in which pixels are arranged in a form of an array; a plurality of signal lines disposed for pixel columns, respectively, of the pixel section; and one resistor string for generating a plurality of reference voltages having different values when a maximum voltage and a minimum voltage are applied to both ends of the resistor string, the resistor string being formed by a series connection body of a plurality of resistor elements. The video display device further includes a plurality of converting sections for converting a digital video signal inputted to the converting sections into an analog signal to be outputted to the signal lines, the converting sections being disposed for the signal lines, respectively. A part within the converting sections, the part converting all or a part of a bit width other than a bit width on a lowest order side included in a total bit width of the video signal into an analog value, includes a code converting section, a plurality of transistors and a plurality of gate electrodes. The code converting section is configured to convert a code of the digital signal into a predetermined code (for example Gray code) of a sequence in which a bit change between successive unit codes occurs at one digit position, and output the predetermined code from a plurality of control lines. The plurality of transistors are disposed for the reference voltages, respectively, and controls output of the corresponding reference voltages. The plurality of gate electrodes are disposed for each of channels of the plurality of transistors, and each gate electrode performs control to turn on and off a local channel. The sequence of the predetermined code is programmed in the plurality of transistors by combinations of connections and disconnections between the gate electrodes and the control lines. In each of the plurality of transistors or each of the transistors excluding one or both of two transistors outputting a maximum reference voltage and a minimum reference voltage among the plurality of transistors, a gate electrode is omitted at a part corresponding to a digit where a bit change occurs between a unit code corresponding to the transistor and an adjacent unit code on one of an upper side and a lower side.

According to an embodiment of the present invention, there is provided another video display device including: a pixel section in which pixels are arranged in a form of an array; a plurality of signal lines disposed for pixel columns, respectively, of the pixel section; and one resistor string for generating a plurality of reference voltages having different values when a maximum voltage and a minimum voltage are applied to both ends of the resistor string, the resistor string being formed by a series connection body of a plurality of resistor elements. The video display device further includes a plurality of converting sections for converting a digital video signal inputted to the converting sections into an analog signal to be outputted to the signal lines, the converting sections being disposed for the signal lines, respectively. A part within the converting sections, the part converting all or a part of a bit width other than a bit width on a lowest order side included in a total bit width of the video signal into an analog value, includes a code converting section, a plurality of transistors, and a plurality of gate electrodes. The code converting section is configured to convert a code of the digital signal into a predetermined code (for example Gray code) of a sequence in which a bit change between successive unit codes occurs at one digit position, and outputting each unit code of the predetermined code in parallel from a plurality of control lines provided as pairs of positive logic lines and negative logic lines. The plurality of transistors are disposed for the reference voltages, respectively, and controls output of the corresponding reference voltages. The plurality of gate electrodes are disposed for each of channels of the plurality of transistors, and each gate electrode performs control to turn on and off a local channel. The sequence of the predetermined code is programmed in the plurality of transistors by combinations of connections of the gate electrodes to positive logic sides and negative logic sides of control line pairs. In each of the plurality of transistors or each of the transistors excluding one or both of two transistors outputting a maximum reference voltage and a minimum reference voltage among the plurality of transistors, a gate electrode at a part corresponding to a digit where a bit change occurs between a unit code corresponding to the transistor and an adjacent unit code on one of an upper side and a lower side is connected to a voltage supplying line for turning on a local channel corresponding to the gate electrode at all times and is disconnected from both a positive logic control line and a negative logic control line.

According to the present invention, it is possible to provide a D/A converter that has a small number of switches and occupies a small area as a whole, and a video display device including the D/A converter.

BRIEF DESCRIPTION OF THE DRAWINGS

FIG. 13 is a diagram of a sequence of another predetermined code than Gray code according to a third embodiment.

DETAILED DESCRIPTION OF THE PREFERRED EMBODIMENTS

Hereinafter, preferred embodiments of the present invention will be described in detail by taking an image display device incorporating therein a digital-to-analog converter in every signal line driving unit as an example with reference to the accompanying drawings.

First Embodiment

Figure 4:
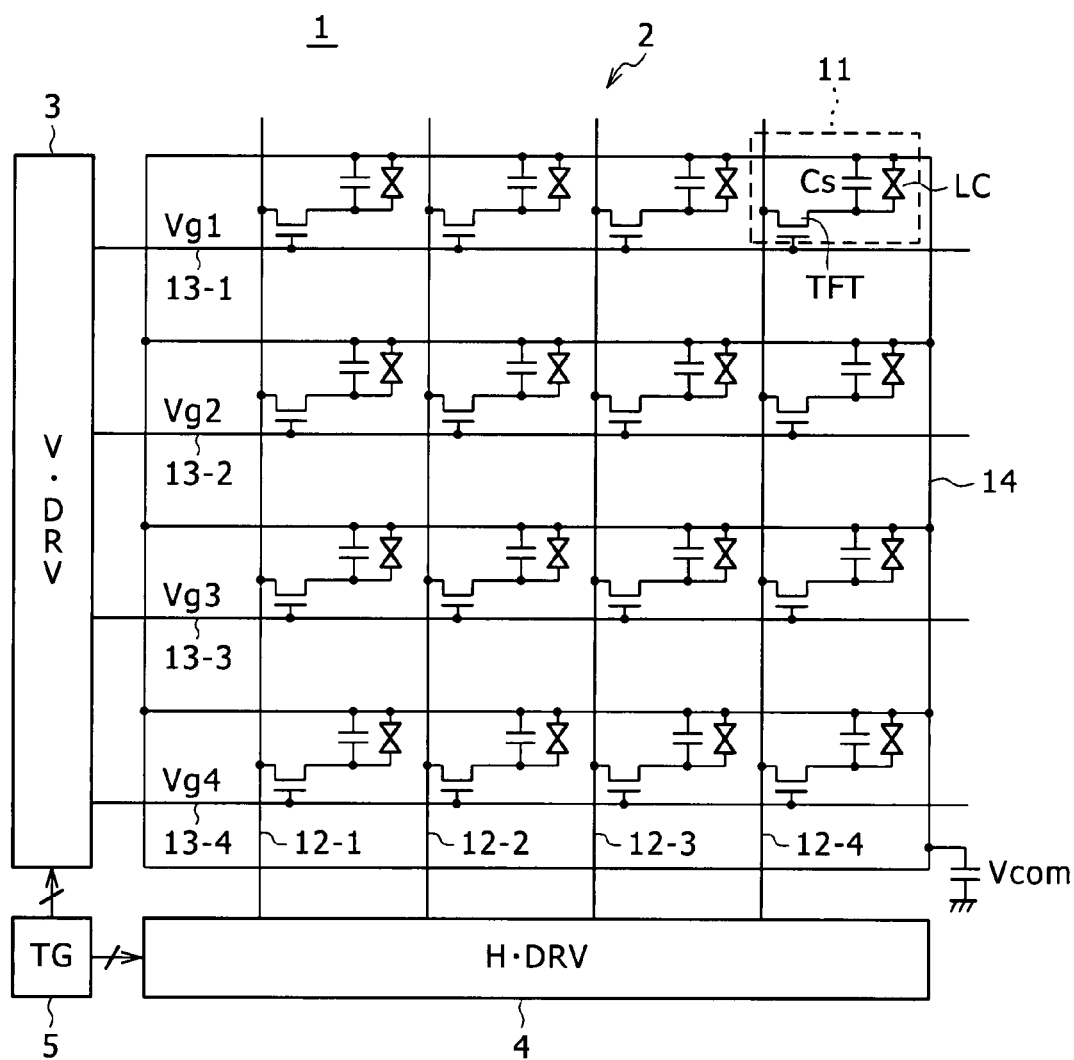
FIG. 4 is a circuit diagram showing an example of configuration of a liquid crystal display panel as a video display device according to an embodiment of the present invention.

FIG. 4 is a circuit diagram showing an example of structure of a liquid crystal display panel as an image display device according to an embodiment of the present invention.

FIG. 4 shows a pixel arrangement for 4 (rows)×4 (columns) as an example for the sake of simplicity.

In a liquid crystal display panel shown in FIG. 4, each of pixels 11 for 4 (rows)×4 (columns) arranged in the form of a matrix includes a thin film transistor TFT, a liquid crystal cell LC having a pixel electrode connected to one of a source and a drain of the thin film transistor TFT, and a holding capacitor Cs having one electrode connected to the source or the drain. Signal lines (data lines) 12-1 to 12-4 are arranged along a column direction of a pixel arrangement so as to correspond to columns of the pixels 11, respectively. Gate lines 13-1 to 13-4 are arranged along a row direction of the pixel arrangement so as to correspond to rows of the pixels 11, respectively.

In the pixels 11, the sources (or drains) of the thin film transistors TFT are connected to the corresponding data lines 12-1 to 12-4, respectively. Gates of the thin film transistors TFT are connected to the gate lines 13-1 to 13-4, respectively. Counter electrodes of the liquid crystal cells LC and the other electrodes of the holding capacitors Cs are commonly connected to a Cs line 14. A predetermined D.C. voltage is supplied as a common voltage Vcom to the Cs line 14.

A pixel portion 2 is thus formed by arranging the pixels 11 in the form of a matrix, arranging the data lines 12-1 to 12-4 so as to correspond to the respective columns of the pixels 11, and arranging the gate lines 13-1 to 13-4 so as to correspond to the respective rows of the pixels 11. In the pixel portion 2, ends on one side of the gate lines 13-1 to 13-4 are connected to output ends of the rows of a vertical driver (V•DRV) 3, respectively.

The vertical driver 3 scans the gate lines 13-1 to 13-4 in a vertical direction (in the column direction) in every display period of time for one picture, thereby successively selecting the pixels connected to the gate lines 13-1 to 13-4, respectively, in rows. That is to say, when the vertical driver 3 supplies a vertical scanning pulse to the gate line 13-1, the pixels of the columns belonging to the first row are all selected. When the vertical driver 3 supplies the vertical scanning pulse to the gate line 13-2, the pixels of the columns belonging to the second row are all selected. Similarly to the above, the vertical scanning pulse is supplied to the gate lines 13-3 and 13-4 in order.

A horizontal driver (H•DRV) 4 is disposed on one side of the pixel portion 2 in the column direction. In addition, a timing generator (TG) 5 for supplying various clock signal and control signals to the vertical driver 3 and the horizontal driver 4 is provided.

The horizontal driver 4 is a semiconductor multi-channel display driver, and has driving units which are provided so as to correspond to the data lines 12-1, 12-2, . . . , respectively.

Figure 5:
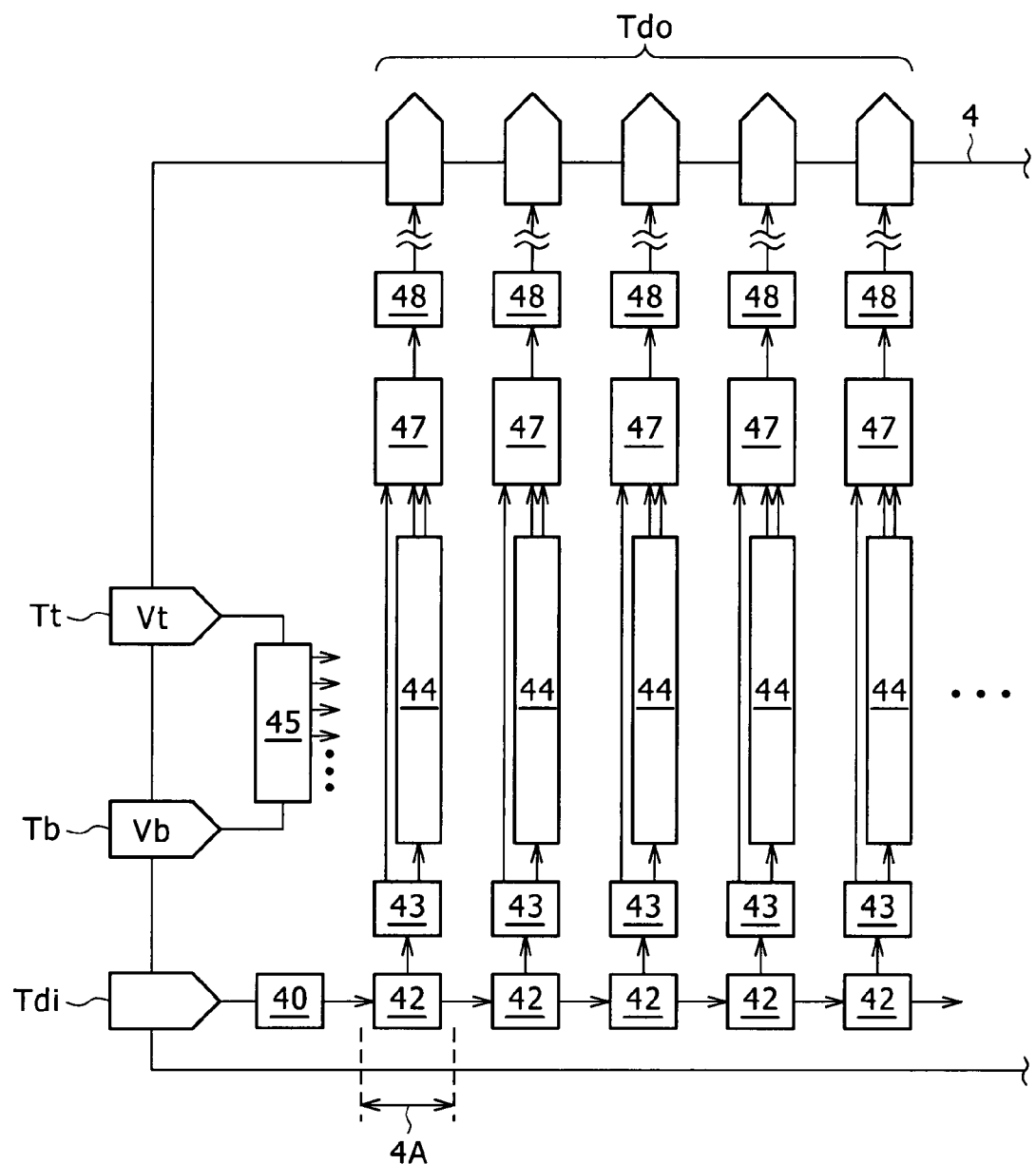
FIG. 5 is a block diagram of a horizontal driver.

FIG. 5 is a block diagram of the horizontal driver 4. This block diagram shows only a configuration related to digital-to-analog converters (D/A portion) as a principal part of the present embodiment. This D/A portion is resistor string type D/A converters, and performs D/A conversion using resistor strings for higher order bits and lower order bits, respectively, in this case.

The horizontal driver 4 has driving units 4A (five units are displayed in FIG. 5) which are provided so as to correspond to the data lines, respectively. A data input terminal Tdi is supplied with digital data as a digital (video) signal. The data input terminal Tdi is provided as a terminal common to all the driving units 4A. Data output terminals Tdo are provided so as to correspond to the driving units 4A, respectively.

The driving units 4A include a shift register 42, a latch circuit 43, a higher order selector 44, a lower order selector 47, and a buffer amplifier 48. In addition, a code converter circuit 40 and a higher order resistor string 45 are provided as a configuration common to all the driving units. Incidentally, a lower order resistor string is incorporated in each lower order selector 47.

While not especially illustrated in the figure, a clock signal from the timing generator 5 (FIG. 4) is input to the shift register 42 and the latch circuit 43. In addition, this clock signal is input to parts that need to be synchronized as required. Thereby all the driving units 4A are synchronized with each other to perform data input, processing, and data output.

Digital data having (N+M) bits is inputted from the data input terminal Tdi. The digital data is constituted by N higher order bits and M lower order bits. The digital data is inputted to the code converter circuit 40, where the digital data is converted from binary code to predetermined code. The predetermined code has a sequence in which a bit change occurs at one digit position between successive unit codes. Such predetermined code is typified by Gray code. Suppose in the following that the code converter circuit 40 performs binary-to-Gray code conversion. Unit codes represent the above-described digital data having (N+M) bits, and all unit codes cover necessary data representations.

The digital data converted from binary code to Gray code is inputted to the shift register 42 of the driving unit 4A adjacent to the code converter circuit 40 in FIG. 5, and is then sequentially transferred within the shift registers 42 in a disposition direction of the driving units 4A.

In a case of point-sequential driving, the transferred data is outputted sequentially (one after another at given time intervals) to the latch circuits 43 within respective channels to be temporarily held therein, and is sequentially sent to a next stage. On the other hand, in a case of line-sequential driving, the data for one display line is concurrently outputted to all the latch circuits 43 at a time point when the holding of the data in all the shift registers 42 is complete, and the data is then concurrently sent to the next stage.

The output of the latch circuit 43 is classified into two systems. That is to say, the N higher order bits held in the latch circuit 43 are outputted to the higher order selector 44, while the M lower order bits held in the latch circuit 43 are outputted to the lower order selector 47.

Figures 3A, 3B:
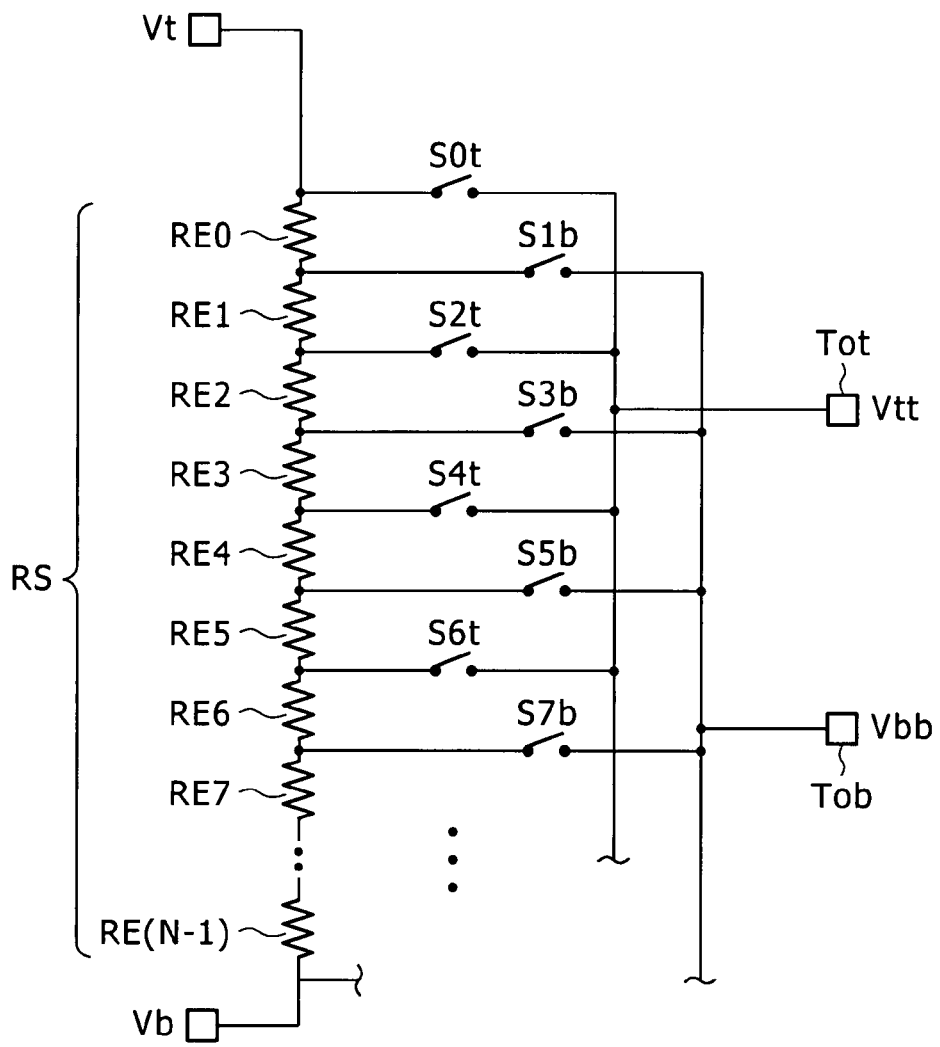
FIG. 3A is a circuit diagram of a higher order D/A converter relating to another background art.
FIG. 3B is a diagram of correspondences between switches of the higher order D/A converter and input bits.

The higher order selector 44 has N switches similarly to the case of the switches S0$t$, S1$b$, S2$t$, S3$b$, . . . shown in FIG. 3A. One of the N switches is selected and is turned on, so that the higher order selector 44 operates. On the other hand, the lower order selector 47 has $2^M$ switches similarly to the case of the select higher order switches S0 to S($2^N$–1) in FIG. 1. One of the $2^M$ switches is selected and is turned on, so that the lower order selector 47 operates.

Figure 1:
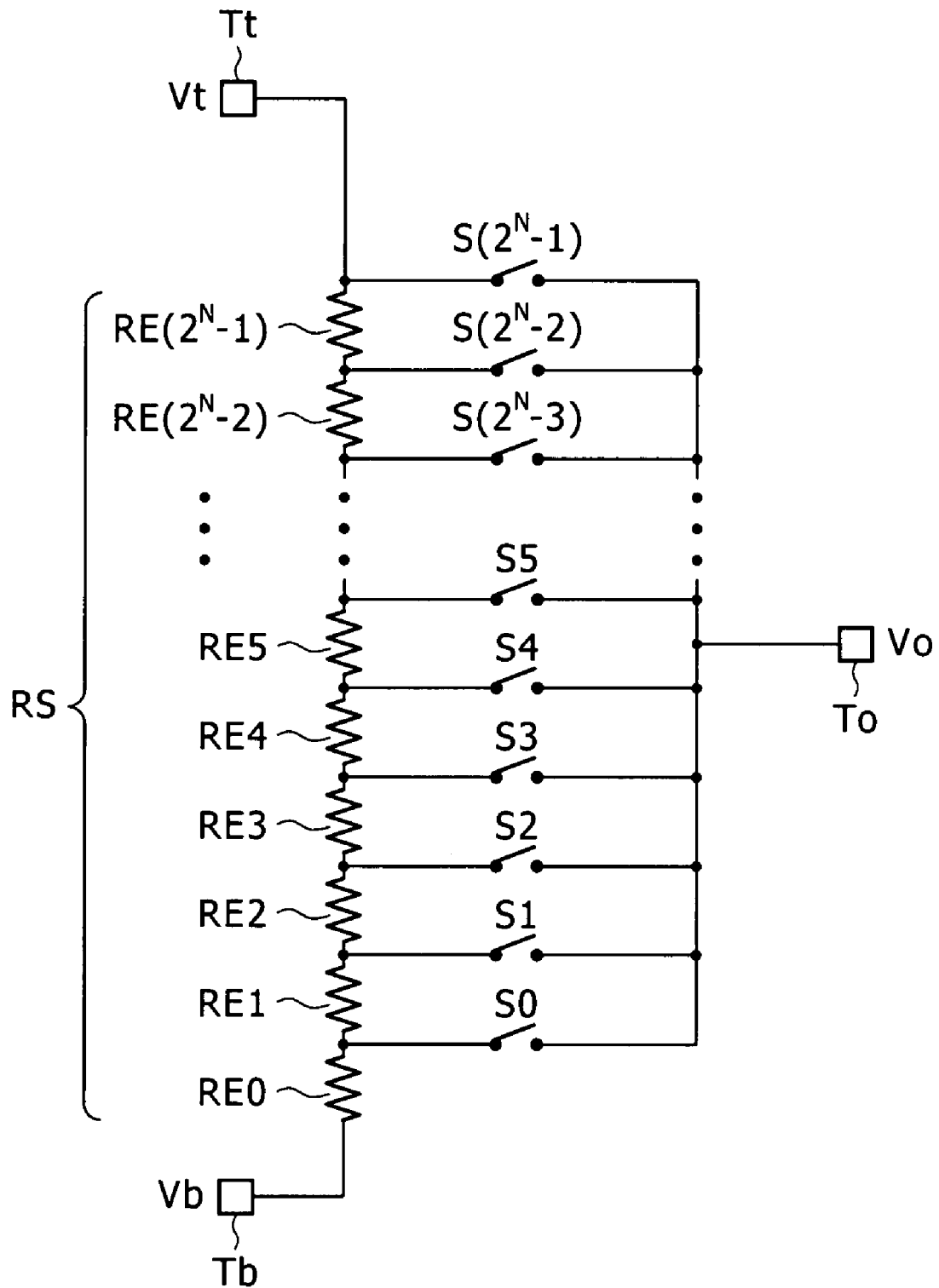
FIG. 1 relates to a background art, and is a circuit diagram showing a basic structure of a resistor string type D/A converter.
Figures 2A, 2B:
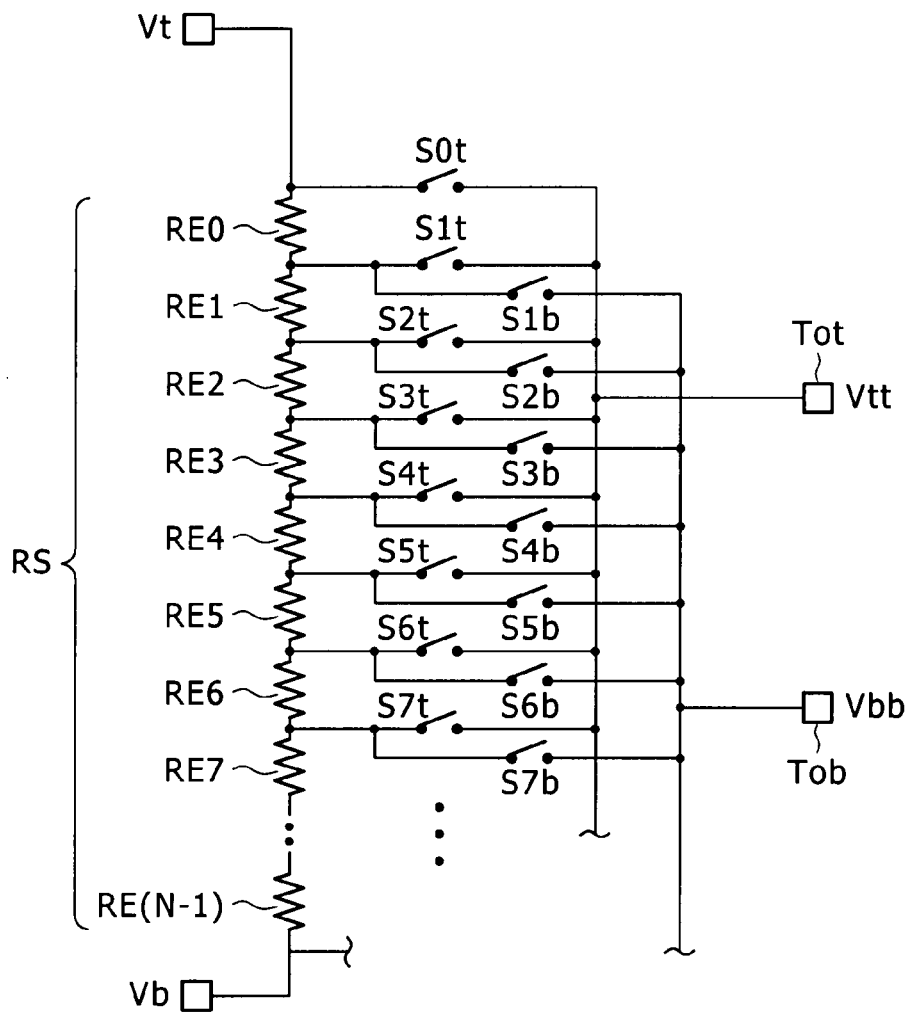
FIG. 2A is a circuit diagram of a higher order D/A converter relating to a background art.
FIG. 2B is a diagram of correspondences between switches of the higher order D/A converter and input bits.

In the present embodiment, the lower order selector 47 for converting a bit width on a lowest order side has to adopt the configuration of FIG. 1 with a large number of switches, while the configuration of FIG. 3A with a smallest number of switches is adopted for the conversion of higher order bits. With the configuration of FIG. 3A, a pair of switches needs to be turned on. As will be described later, in order to turn on a pair of switches, the present embodiment uses the predetermined code such as the Gray code or the like in which a bit change occurs at one digit position within a unit code.

This eliminates a need for a special decoder for turning on a pair of switches.

The horizontal driver 4 shown in FIG. 5 has a higher order resistor string 45 common to all the higher order selectors 44.

The higher order resistor string 45 is a series connection body of higher order resistor elements the number of which corresponds to the number N of higher order bits, that is, N higher order resistor elements (corresponding to the resistor elements RE0 to RE(N–1) in FIG. 1) similarly to the resistor string RS shown in FIG. 3A. A lower order resistor string not shown in the figure, the lower order resistor string being included in the lower order selector 47, is a series connection body of lower order resistor elements the number of which corresponds to the number M of lower order bits, that is, $2^M$ lower order resistor elements similarly to the resistor string RS shown in FIG. 1.

An analog upper limit voltage Vt is applied to one end of the higher order resistor string 45 through a Vt input terminal Tt. An analog lower limit voltage Vb is applied to another end of the higher order resistor string 45 through a Vb input terminal Tb. At a time of the application of the voltages, when each of the resistance values of the resistor elements is equal to "R", a higher order voltage value obtained by equally dividing (Vt–Vb) by the number of resistor elements is developed at each of connection nodes between the adjacent resistor elements in the higher order resistor string 45. This higher order voltage value becomes the reference voltage of the lower order selector 47 (voltage corresponding to the above-described threshold voltage Vt and the analog lower limit voltage Vb supplied to the higher order selector 44). The higher order voltage value will hereinafter be referred to as reference voltage. Incidentally, it is not necessary to set all the resistance values of the resistor elements equal to each other, and the respective resistance values of the resistor elements are determined such that the values of voltages output from the plurality of resistor elements are different from each other.

The reference voltages generated between the resistor elements are supplied to all the higher order selectors 44. In addition, in the case where the same connection relationship as in FIG. 3A is obtained, the analog upper limit voltage Vt and the analog lower limit voltage Vb are supplied to the higher order selectors 44.

Note that, unlike FIG. 1, a structure may be adopted such that one of the analog upper limit voltage Vt and the analog lower limit voltage Vb is supplied to the higher order selectors 44. In this case, the number of resistor elements needs to be increased by one from that of FIG. 3A.

When the resistance values of the resistor elements are equal to each other, the reference voltages input to each of the switches of the higher order selector 44 have a voltage value that sequentially changes by a fixed voltage difference expressed by (Vt−Vb)/N. When the resistance values of the resistor elements are different from each other, the reference voltages have a value that differs according to changes in the resistance value.

The higher order selector 44 selects two reference voltages having voltage values corresponding to the input higher order bits and having a voltage difference maintained at the fixed voltage difference from the N reference voltages generated in the higher order resistor string 45. The higher order selector 44 then outputs the two reference voltages.

The lower order selector 47 applies the two reference voltages to both ends of the lower order resistor string incorporated in the lower order selector 47, and subdivides the potential difference to generate $2^M$ voltages. The lower order selector 47 selects one analog voltage corresponding to the input lower order bits from the $2^M$ voltages. The lower order selector 47 then outputs the analog voltage.

The analog voltages output from the lower order selectors 47 are passed through the buffer amplifiers 48, further processed as required, and then input from the data output terminals Tdo to the respectively corresponding signal lines (the data lines 12-1 to 12-4 in FIG. 4) to drive the signal lines.

Figure 6:
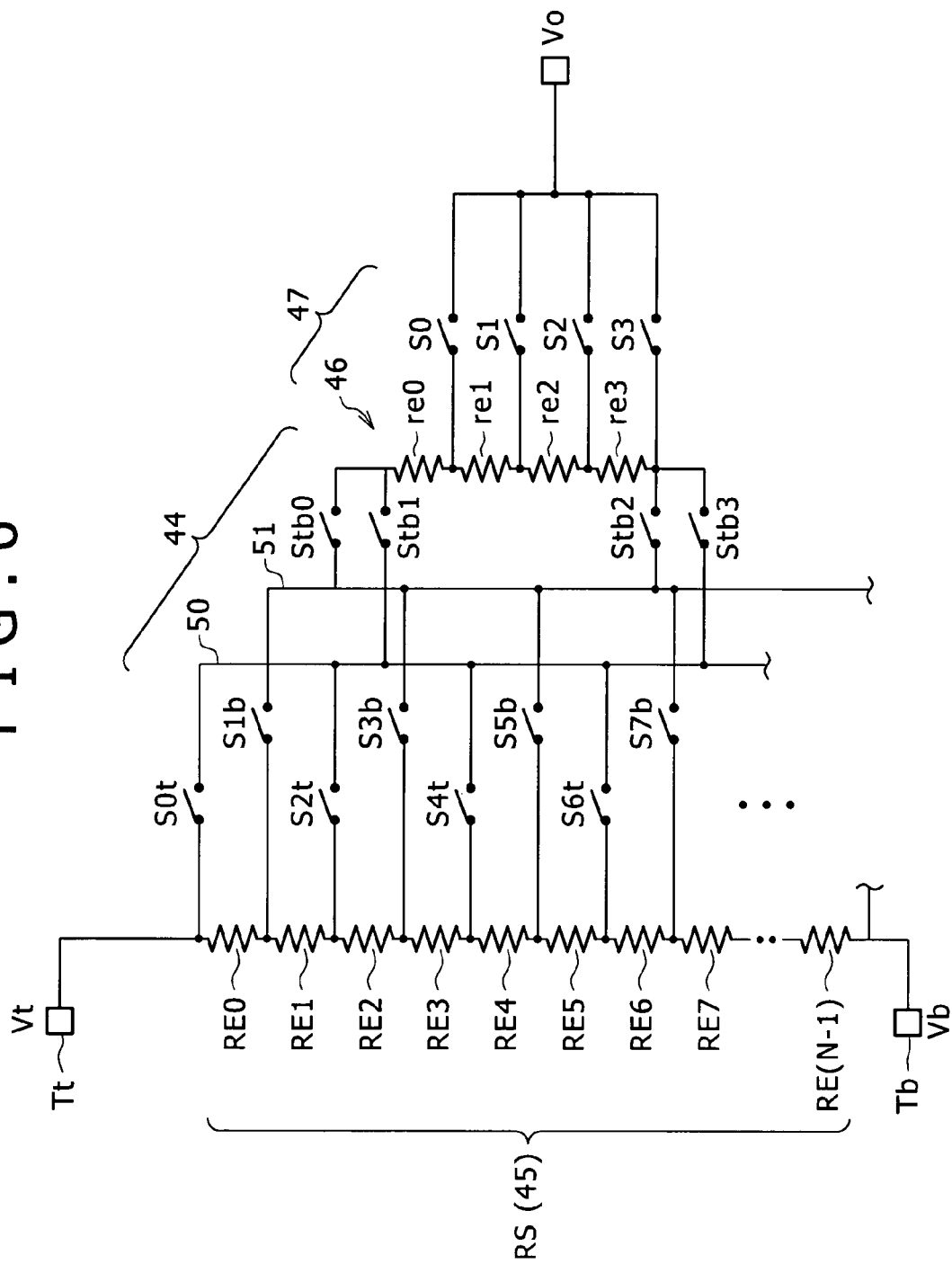
FIG. 6 is a circuit diagram of the parts of a higher order selector and a lower order selector and a higher order resistor string.

FIG. 6 is a circuit diagram showing a part of a higher order selector 44, a higher order resistor string 45, and a lower order selector 47 shown in FIG. 5.

A resistor string RS formed by a series connection body of a plurality of N resistor elements RE0, RE1, . . . , and RE(N−1) is connected between the input terminal Tb for the analog lower limit voltage Vb and the input terminal Tt for the analog upper limit voltage Vt, thus forming a higher order resistor string 45 in FIG. 5.

Nodes between the resistor elements and a connection node between a resistor element at an end and the input terminal Tb or the input terminal Tt (a connection node on the input terminal Tt side in this case) are connected with respective switches.

In the example of FIG. 6, a switch S0t is connected to the connection node between the input terminal Tt and the resistor element RE0. A switch S1b is connected to the connection node between the resistor elements RE0 and RE1. Similarly, a switch S2t is connected to the connection node between the resistor elements RE1 and RE2. This connection relationship is repeated even for other switches S3b, S4t, S5b, S6t, S7b, . . . while the resistor elements are shifted one by one.

These switches are included in the higher order selector 44 in FIG. 5.

Within the higher order selector 44, the outputs of the odd-numbered switches S0t, S2t, S4t, S6t, . . . are connected to a common line 50, and the outputs of the even-numbered switches S1b, S3b, S5b, S7b, . . . are connected to a common line 51.

Within the lower order selector 47, a lower order resistor string 46 as a series connection body of resistor elements re0, re1, re2, and re3 is provided. Switches Stb0 and Stb1 in parallel with each other are connected to one end of the lower order resistor string 46. Switches Stb2 and Stb3 in parallel with each other are connected to another end of the lower order resistor string 46. The inputs of the switches Stb0 and Stb1 are connected to the common lines 50 and 51. The inputs of the switches Stb2 and Stb3 are similarly connected to the common lines 50 and 51.

The four switches Stb0, Stb1, Stb2, and Stb3 are to invert the relation in magnitude between the two reference voltages output from the common lines 50 and 51 as appropriate so that the higher reference voltage is applied to the resistor element re0 side of the lower order resistor string 46 and the lower reference voltage is applied to the resistor element re3 side of the lower order resistor string 46. The four switches Stb0, Stb1, Stb2, and Stb3 are included in the higher order selector 44. One bit is sufficient for a control signal for controlling the switches, and the control signal is supplied from a control unit not shown in the figure.

The lower order selector 47 is further provided with $2^M$ (M=2 in this case) switches S0, S1, S2, and S3 for converting the M lower order bits. The switches S0, S1, S2, and S3 are connected between the resistor elements re0 and re1, between the resistor elements re1 and re2, between the resistor elements re2 and re3, and to another end of the resistor element re3, respectively.

Description will next be made of binary (B) code converted by the code converter circuit 40 shown in FIG. 5, Gray (G) code, and the configuration of the converter circuit.

Figures 7, 8:
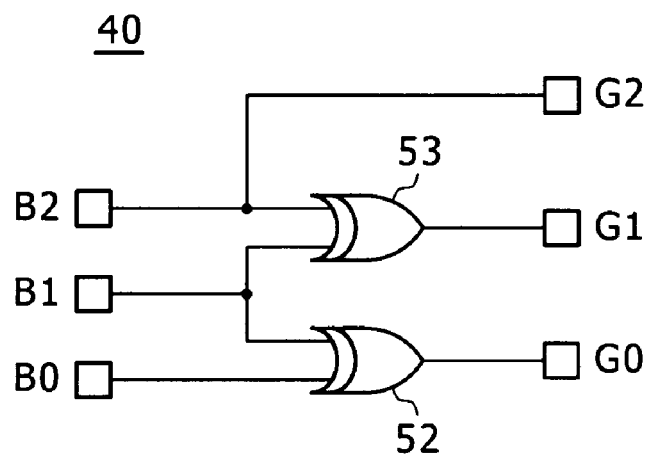
FIG. 7 is a diagram of correspondences between sequences of B code and G code.
FIG. 8 is a circuit diagram of a code converter circuit.

FIG. 7 shows correspondences between B codes and G codes and the sequences of the B codes and the G codes. In this case, three-digit codes are taken as an example.

In the case of the B codes, a carry is produced from a lower order code in order, whereas it is specified in the case of the G codes that a bit change between for example a unit code (this unit code is generally referred to as a G code) of "100" and an adjacent unit code of "101" occur at one digit position. This regularity is observed in the sequence of unit codes representing all numbers. In the case of the B codes, on the other hand, bit change occurs at one or two digit positions, and the regularity is complex.

The present embodiment realizes the higher order selector using the simplicity of the regularity of the G codes.

FIG. 8 shows a circuit example of the code converter circuit 40.

The code converter circuit 40 shown in the diagram is supplied with a B code generalized by (B2, B1, B0), and outputs the unit code of a G code (hereinafter referred to as a G unit code) generalized by (G2, G1, G0).

The code converter circuit 40 is formed by two exclusive OR (EXOR) gate circuits 52 and 53. The least significant bit B0 of the B code is inputted to one input of the EXOR gate circuit 52. The bit B1 is input to another input of the EXOR gate circuit 52 and one input of the EXOR gate circuit 53. The most significant bit B2 is input to another input of the EXOR gate circuit 53.

The most significant bit G0 of the G unit code is outputted from the EXOR gate circuit 52. The bit G1 is outputted from the EXOR gate circuit 53. The most significant bit B2 of the B code is outputted as the most significant bit G2 of the G unit code as it is.

The EXOR gate circuit is an OR circuit that outputs "0" as an exception when "1" is inputted to both inputs. Therefore, when a B code (B2, B1, B0)=(1, 1, 1), for example, is inputted, the EXOR gate circuit outputs a G unit code (G2, G1, G0)=(1, 0, 0).

The higher order selector 44 shown in FIG. 6 has switches S0t, S1b, S2t, S3b, S4t, S5b, S6t, S7b, . . . the number of which is equal to the number N of higher order bits. When control lines for the N bits are connected to the respective switches, the number of pieces of wiring of the control lines becomes enormous. Securing a space for the wiring significantly impairs the effect of reducing the number of switches.

Accordingly, the present embodiment uses multigate transistors to program a code sequence by a gate connection pattern of the multigate transistors in advance. Thereby the number of control lines is reduced.

Figure 9:
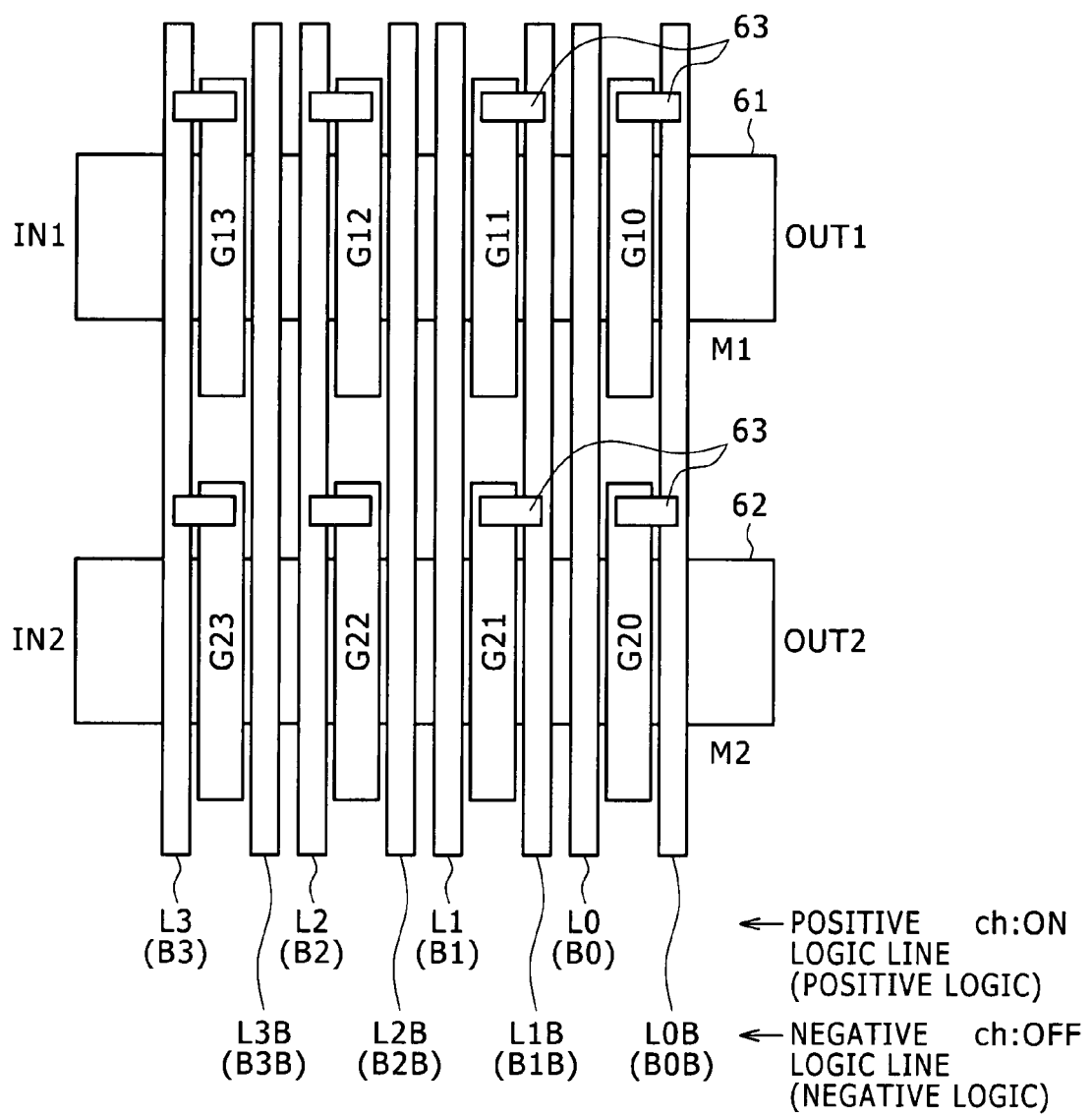
FIG. 9 is a schematic pattern diagram of multigate transistors ready for B code.

FIG. 9 is a diagram of assistance in explaining the multigate transistors, and illustrates a case where a four-bit B code sequence is programmed. In this case, two transistors (corresponding to individual switches described above) M1 and M2 having multiple gates are shown.

The transistors M1 and M2 have a similar configuration. Description in the following will be made of the transistor M1.

The transistor M1 has a semiconductor channel layer 61 for example provided by diffusing an impurity into a semiconductor substrate or formed by a semiconductor conductive film insulated on the substrate. The semiconductor channel layer 61 in the example shown in FIG. 9 has a rectangular pattern that is long in one direction. An input end part IN1 of the semiconductor channel layer 61 is connected to a node of resistor elements RE to be supplied with a reference voltage of a certain value. When the transistor M1 is turned on, the transistor M1 outputs the input reference voltage from an output end part OUT1 on another side of the semiconductor channel layer 61.

Four gate electrodes G10, G11, G12, and G13 corresponding to respective bits (digits of a code) are arranged at predetermined intervals in such a manner as to traverse the width (length of a shorter side) of the semiconductor channel layer 61. A thin gate insulating film (an oxide film in general) is interposed between each of the gate electrodes G10, G11, G12, and G13 and the semiconductor channel layer 61. Thereby a MOS structure is formed. A part of the semiconductor channel layer 61 directly under the gate electrode controlled by the MOS structure forms a local channel. The conductivity of parts of the semiconductor channel layer 61 between local channels is heightened by increasing impurity concentration. Thus, when four MOS structures (unit MOS transistors) are all turned on, the four local channels are connected to each other as a channel via impurity regions of high conductivity between the local channels, so that the transistor M1 is turned on. On the other hand, when even one of the local channels cannot be turned on, the channel is electrically disconnected at the intermediate point, so that the transistor M1 is turned off.

Each gate electrode is formed of polysilicon, for example.

Whether to turn on the local channels is determined by voltages applied to the respective gate electrodes. In a case of an N channel type, for example, the local channel is turned on when a positive voltage (for example a power supply voltage Vdd) is applied to the local channel, and the local channel is turned off when no voltage is applied to the local channel (or when a voltage of 0 [V] is applied to the local channel). Whether the local channels are turned on or off is determined by connection relationship between wiring (control lines) corresponding to four input bits and the gate electrodes.

In the example of FIG. 9, a control line is provided as a pair of a positive logic line and a negative logic line for each bit. The control line is formed by for example a polysilicon layer or a metal wiring layer higher than the gate electrodes.

In the present embodiment, positive logic turns on a local channel when a bit is "1". Negative logic is the opposite. Control lines to which "B (bar)" of symbols of the control lines shown in FIG. 9 is not added are positive logic lines L0, L1, L2, and L3. Control lines to which "B" is added are negative logic lines L0B, L1B, L2B, and L3B.

A contact 63 shown in FIG. 9, for each bit (digit), is connected to a positive logic line when the local channel is turned on and is connected to a negative logic line when the local channel is turned off. Whether to connect the contacts 63 of the transistor M1 in FIG. 9 to a positive logic line or a negative logic line is determined so as to turn on the semiconductor channel layer 61 when an input B code=(1, 1, 0, 1). Whether to connect the contacts 63 of the transistor M2 in FIG. 9 to a positive logic line or a negative logic line is determined so as to turn on the semiconductor channel layer 61 when an input B code=(1, 1, 0, 0).

Each contact 63 is formed by a conductive plug (and local wiring) and the like for connecting a gate electrode and a control line to each other.

Thus, the B code sequence is programmed by the multigate transistors (transistors M1 and M2) and the connection relationship of the gate electrodes of the multigate transistors with the control lines. Thereby, the number of control lines is reduced, or a need for a decoder is eliminated.

However, the transistor structure of FIG. 9 cannot be applied as it is to the switches S0t, S1b, S2t, S3b, S4t, S5b, S6t, S7b, . . . shown in FIG. 6. This is because of a rule that one of these switches must be turned on for two successive digital codes. With the structure of FIG. 9, it is possible to observe the rule partially, but it is impossible to observe the rule for the entire code sequence.

Figure 10:
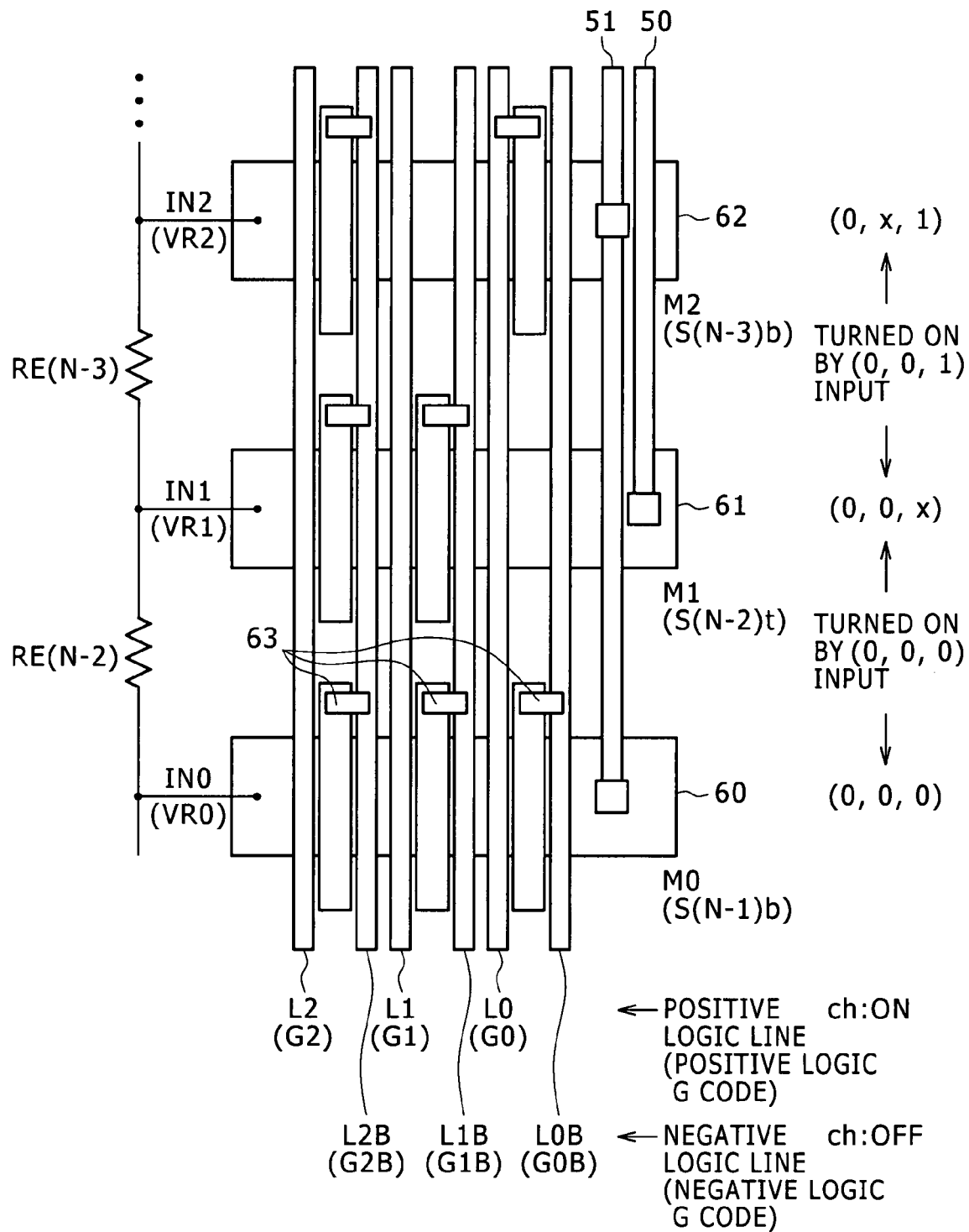
FIG. 10 is a schematic pattern diagram of multigate transistors ready for G code.

FIG. 10 shows a selector of a multigate transistor type in which a G code sequence is programmed in the present embodiment. Incidentally, the selector in FIG. 10 is ready for three bits to simplify the figure.

The selector shown in the diagram differs from the structure described with reference to FIG. 9 in that gate electrodes at bit change positions in the digits of the unit G codes among gate electrodes controlled by a plurality of 2N control lines to which a unit G code of N bits is input in parallel are omitted. A local channel under a gate electrode is on at all times when no voltage is applied, and a local channel is also on at all times when no gate electrode is formed. Thus, when one gate electrode corresponding to a bit change portion is not formed in a transistor, the local channel maintains an on state regardless of whether a digit of a G unit code which digit corresponds to this portion is "1" or "0".

Specifically, FIG. 10 shows transistors M0, M1, and M2 formed in correspondence with three G unit codes=(0, 0, 0), (0, 0, 1), and (0, 1, 1). The three transistors M0, M1, and M2 correspond to three switches S(N−1)b, S(N−2)t, and S(N−3)b on a lower order side which switches do not appear in FIG. 6.

Inputs IN0, IN1, and IN2 of the three transistors M0, M1, and M2 are connected with resistor elements RE(N−2), RE(N−3), . . . , respectively, as shown in FIG. 10. Reference voltages VR0, VR1, and VR2 are applied to the inputs IN0, IN1, and IN2, respectively.

In FIG. 10, a gate electrode at a part of a lowest order digit in the transistor M1 is omitted, and thus the digit is "x" ("1" or "0": arbitrary). In the transistor M2, a gate electrode at a part of a middle digit is omitted, and thus the digit is "x".

Hence, the transistors M1 and M2 are both turned on when an input unit G code is (0, 0, 1). Next, when a unit G code (0, 1, 1) is input, the transistor M2 and the following transistor not shown in the figure are similarly selected. Thus an operation of selecting a pair of two adjacent transistors is made possible.

Figure 11:
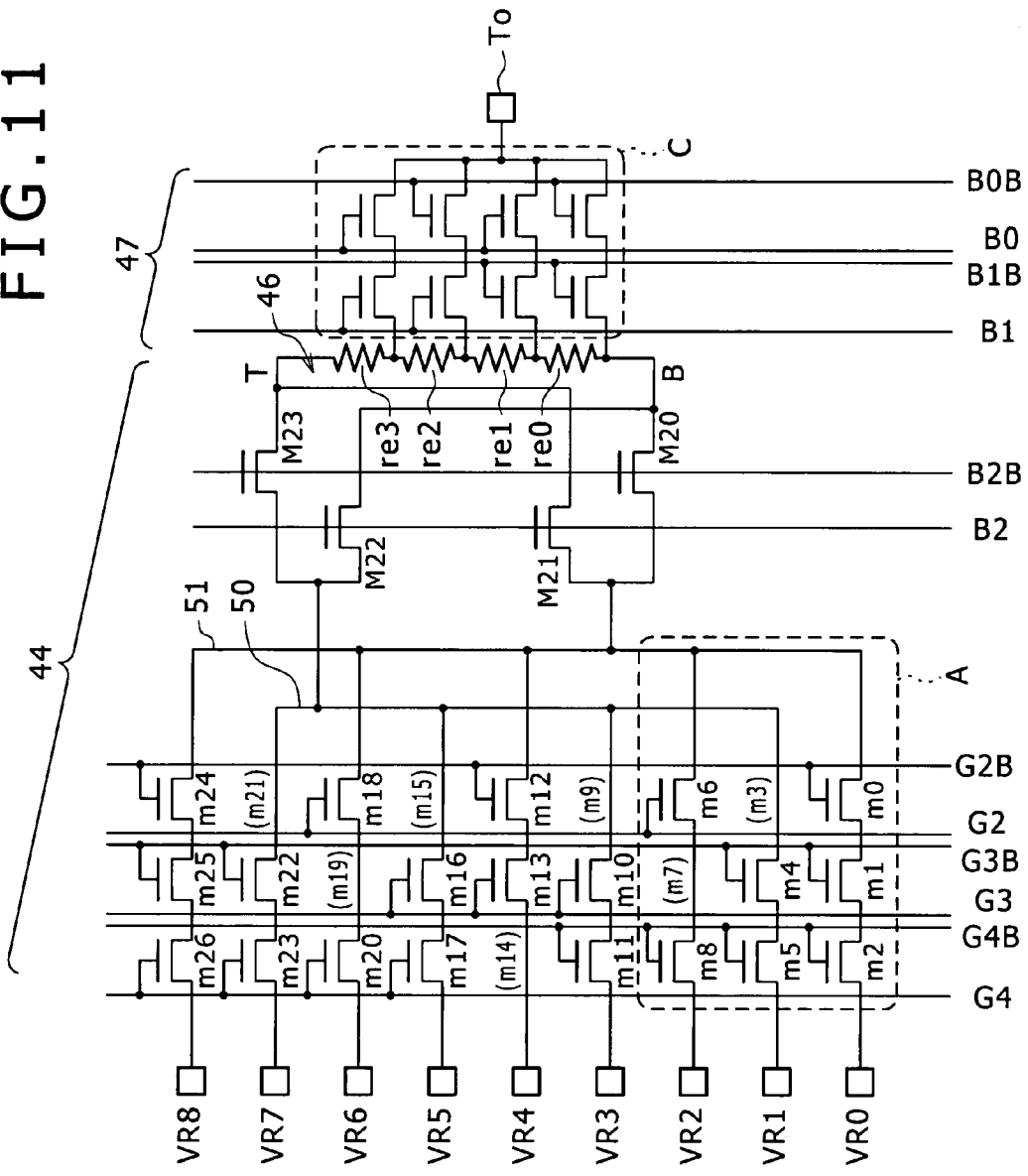
FIG. 11 shows an equivalent circuit in more detail of a switch part in FIG. 6.

FIG. 11 shows an equivalent circuit in more detail of a switch part in FIG. 6, supposing use of the selector of the multigate transistor type.

A higher order selector 44 and a lower order selector 47 shown in FIG. 11 form a configuration for receiving three higher order bits as a G code (G4, G3, G2) and receiving two lower order bits as a B code (B0, B1), converting each of the codes, and consequently obtaining one analog voltage from an output terminal To. The number of effective input bits is five, and additionally a B code (B2) of one bit is necessary for inversion control of relationship in magnitude between reference voltages by transistors M20 to M23.

In the higher order selector 44, of unit transistors m0 to m26, three for each switch, the unit transistors m3, m7, m9, m14, m15, m19, and m21, whose gate electrodes are omitted, are not formed, and thus local channels at the parts are on at all times.

The four transistors M20 to M23 for inversion control of relationship in magnitude between reference voltages are connected to common lines 50 and 51. Further, a lower order resistor string 46 is connected to a higher order output node T and a lower order output node B of the higher order selector 44. The part of the lower order selector 47 (another broken line part C in FIG. 11) for converting the two bits, the part of the lower order selector 47 being connected to the lower order resistor string 46, is formed similarly to FIG. 9, and thus description thereof in the following will be omitted.

The higher order selector 44 is supplied with nine reference voltages VR0 to VR8. The higher order selector 44 can output one of the nine reference voltages according to an input G unit code (G4, G3, G2). A part A enclosed by a broken line in FIG. 11 corresponds to the pattern diagram of FIG. 10.

In FIG. 11, the gate electrode omitting method described with reference to FIG. 10 is applied to other higher order transistors.

The three-bit selector is formed by the following procedure.

First, nine multigate transistors in which gate electrodes equal in number to the number of bits can be arranged are prepared. Then, the transistors connected to the reference voltages VR0, VR1, VR2, . . . , and VR8 are respectively associated with G codes (0, 0, 0), (0, 0, 1), (0, 1, 1), . . . , and (1, 0, 0) in order. Further, three unit transistors connected in series with each other are respectively associated from a left to a right with digits from highest order to lowest order of a code.

After such associations are established, the gate of a unit transistor corresponding to a bit that is changed from that of an immediately preceding code of G code is removed, so that the unit transistor is not formed at the part of the removed gate and that part is on at all times. Three unit transistors for a first G code and three unit transistors for a last G code are both allowed to remain. Incidentally, depending on the arrangement, three unit transistors may be left in only the transistor corresponding to one of the first G code and the last G code. In this case, one of an analog upper limit voltage Vt and an analog lower limit voltage Vb is outputted as a reference voltage as it is. Further, a configuration in which three unit transistors are left in every switch is possible.

Operation will be described with reference to FIG. 10 and FIG. 11.

When the unit transistors m0 to m26 are N-type MOS transistors, a digital signal of "1" turns on the transistors and makes the transistors conduct. When a G unit code (0, 0, 0) is input as three higher order bits, the transistor having gate electrodes connected to the control lines G2B, G3B, and G4B (the transistor having the unit transistors m2, m1, and m0) is turned on. In addition, the transistors connected to a control line B2B are turned on. Thus, the reference voltage VR1 appears at the higher order output node T, and the reference voltage VR0 appears at the lower order output node B.

When the three higher order bits are (0, 1, 0), the three higher order bits are converted into (0, 1, 1) by Gray code conversion by the code converter circuit 40 shown in FIG. 8. The transistor assigned to the G unit code (0, 1, 1) has the unit transistors m11, m10, and (m9), of which the unit transistor m9 is not formed. Hence, this transistor and the adjacent transistor having the unit transistors m8, (m7), and m6 are simultaneously turned on. This is because the middle unit transistor m7 is omitted in the adjacent transistor having the unit transistors m8, (m7), and m6. Thus, the reference voltage VR3 appears at the higher order output node T, and the reference voltage VR2 appears at the lower order output node B.

When such omission of unit transistors is performed for the entire G code sequence shown in FIG. 7, reference voltages necessary for the lower order selector 47 can be outputted to the higher order output node T and the lower order output node B.

In the case of this configuration, however, relationship in magnitude between the voltages supplied to the lower order resistor string 46 is inverted by the value of the least significant bit on the higher order side. In FIG. 11, this problem is solved by providing the transistors M20 to M23 and changing a combination of two transistors selected by the bit B2.

Incidentally, it is possible to omit the transistors M20 to M23 in FIG. 11 by changing a method of selecting switches S0 to S3 (see FIG. 6) on the basis of a correspondence between the values of the reference voltages outputted to the higher order output node T and the lower order output node B and the lower order bits.

An analog voltage output from the output terminal To in FIG. 11 is outputted through a buffer amplifier 48 in FIG. 5 to a corresponding signal line.

Thus, it is possible to realize a driving unit 4A having a D/A part that includes a small number of switches and a small number of control lines and occupies a small area. The video display device is becoming larger in size, and the number of horizontal pixels of the video display device is increasing. The reduction of the area occupied by the individual driving unit 4A greatly contributes to reductions in size and cost of a driving IC.

Second Embodiment

Figure 12:
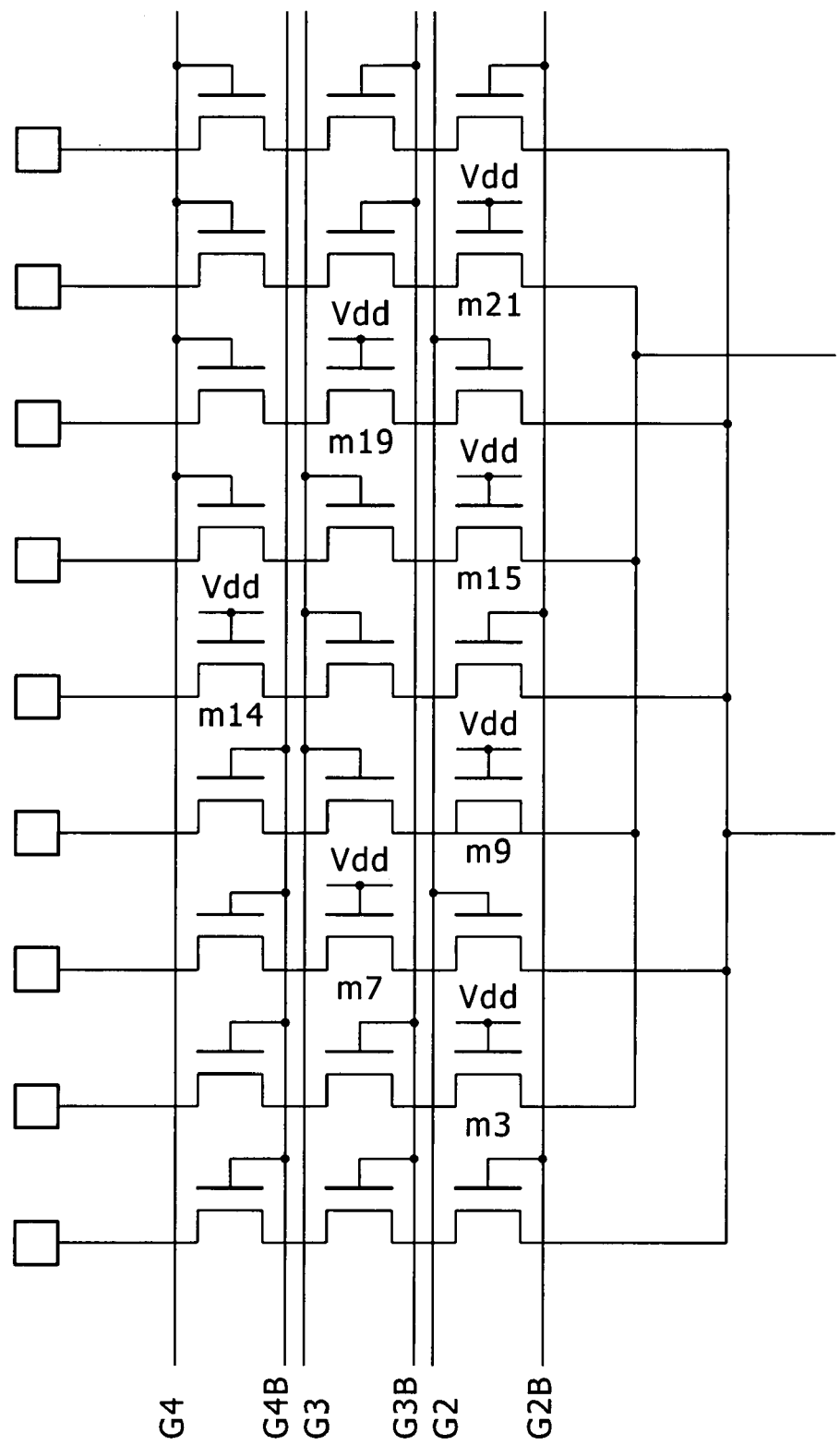
FIG. 12 shows an equivalent circuit of a switch part of a higher order selector in a second embodiment.

FIG. 12 shows an equivalent circuit of a switch part of the higher order selector 44 in a second embodiment.

In the first embodiment, gate electrodes in bit change parts are omitted, so that unit transistors are not formed in the parts. In the present embodiment, the unit transistors themselves are formed, and the gates of the unit transistors are connected to a predetermined voltage supplying line, for example a power supply voltage supplying line without being connected to any of a positive logic line and a negative logic line. Thereby the local channels are on at all times.

FIG. 12 indicates that gate electrodes in parts of unit transistors m3, m7, m9, m14, m15, m19, and m21 are not connected to any of a positive logic line and a negative logic line, and are electrically fixed to a power supply voltage Vdd so that the unit transistors m3, m7, m9, m14, m15, m19, and m21 are on at all times.

Third Embodiment

In addition, the present invention is not limited to conversion of binary code into Gray code. The present invention provides similar effects for a code in which a bit change occurs at one digit position between successive codes even when the code is not the Gray code.

Figure 13:
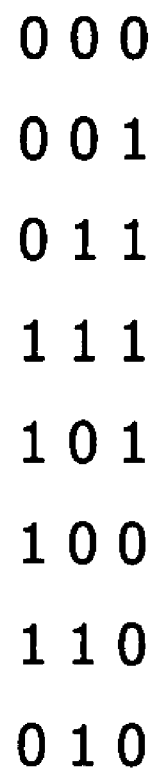

FIG. 13 shows an example of a sequence of such a code.

Though this code is different from the Gray code, only one bit differs between an upper code and a lower code. Binary code is converted into such a code, and the sequence of the code is programmed within a transistor array by one of the methods according to the first to third embodiments described above, whereby similar effects to those of the foregoing embodiments are obtained.

It is to be noted that while a two-stage D/A conversion part is provided in the first to third embodiments, the present invention is applicable to a D/A conversion part of more stages.

In addition, while the D/A conversion part is of a resistor string type, the present invention is applicable to other configurations. That is, the D/A conversion part does not need to be of the resistor string type as long as the D/A conversion part has a reference voltage generating part for generating a plurality of reference voltages.

Further, the present invention is applicable to D/A converters in display devices other than liquid crystal display devices, audio devices, and the like.

According to the embodiments of the present invention, it is possible to suppress an increase in area even when the number of bits of a D/A converter is increased.

By suppressing an increase in area, it is possible to suppress an increase in parasitic capacitance parasitized on each of the wiring nodes, and suppress a degradation of a conversion speed.

It should be understood by those skilled in the art that various modifications, combinations, sub-combinations and alterations may occur depending on design requirements and other factors insofar as they are within the scope of the appended claims or the equivalents thereof.

What is claimed is:

1. A digital-to-analog converter comprising
a converting section configured to convert all or a part of a bit width other than a bit width on a lowest order side included in a total bit width of an input digital signal into an analog value,
wherein said converting section includes
a code converting section configured to convert a code of said digital signal into a predetermined code of a sequence in which a bit change between successive unit codes occurs at one digit position, and output the predetermined code from a plurality of control lines,
a reference voltage generating section configured to generate a plurality of reference voltages,
a plurality of transistors disposed for said reference voltages, respectively, said plurality of transistors controlling output of the corresponding reference voltages, and
a plurality of gate electrodes disposed for each of channels of said plurality of transistors, each gate electrode performing control to turn on and off a local channel,
the sequence of said predetermined code is programmed in said plurality of transistors by combinations of connections and disconnections between said gate electrodes and said control lines, and
in each of said plurality of transistors or each of the transistors excluding one or both of two transistors outputting a maximum reference voltage and a minimum reference voltage among said plurality of transistors, said gate electrode is omitted at a part corresponding to a digit where a bit change occurs between a unit code corresponding to said transistor and an adjacent unit code on one of an upper side and a lower side.

2. The digital-to-analog converter according to claim 1, wherein said control lines are disposed as a pair of a positive logic control line and a negative logic control line for each bit of said predetermined code, and
each bit of said predetermined code is programmed according to whether a control line to which said gate electrode is connected is one of said positive logic control line and said negative logic control line.

3. The digital-to-analog converter according to claim 2, wherein 2N said control lines are disposed in correspondence with said predetermined code of N bits, and traverse said plurality of transistors, and
each of said plurality of transistors has (N−1) said gate electrodes, and each of the (N−1) said gate electrodes is connected to one of a positive logic side and a negative logic side of a corresponding control line pair.

4. A digital-to-analog converter comprising
a converting section configured to convert all or a part of a bit width other than a bit width on a lowest order side included in a total bit width of an input digital signal into an analog value,
wherein said converting section includes
a code converting section configured to convert a code of said digital signal into a predetermined code of a sequence in which a bit change between successive unit codes occurs at one digit position, and output each unit code of said predetermined code in parallel from a plurality of control lines provided as pairs of positive logic lines and negative logic lines,
a reference voltage generating section configured to generate a plurality of reference voltages,
a plurality of transistors disposed for said reference voltages, respectively, said plurality of transistors controlling output of the corresponding reference voltages, and
a plurality of gate electrodes disposed for each of channels of said plurality of transistors, each gate electrode performing control to turn on and off a local channel,
the sequence of said predetermined code is programmed in said plurality of transistors by combinations of connections of said gate electrodes to positive logic sides and negative logic sides of control line pairs, and
in each of said plurality of transistors or each of the transistors excluding one or both of two transistors outputting a maximum reference voltage and a minimum reference voltage among said plurality of transistors, said gate electrode at a part corresponding to a digit where a bit change occurs between a unit code corresponding to said transistor and an adjacent unit code on one of an upper side and a lower side is connected to a voltage supplying line for turning on a local channel corresponding to said gate electrode at all times and is disconnected from both a positive logic control line and a negative logic control line.

5. The digital-to-analog converter according to claim 4, wherein 2N said control lines are disposed in correspondence with said predetermined code of N bits, and traverse said plurality of transistors, and each of said plurality of transistors has N said gate electrodes, each of (N−1) of said N gate electrodes is connected to one of a positive logic side and a negative logic side of a corresponding control line pair, and one remaining gate electrode is connected to a voltage supplying line for turning on a local channel corresponding to said gate electrode at all times and is disconnected from both a positive logic side and a negative logic side of a corresponding control line pair.

6. The digital-to-analog converter according to claim 1, wherein said reference voltage generating section includes a resistor string for generating a plurality of voltage values different from each other when a maximum voltage and a minimum voltage are applied to both ends of said resistor string, said resistor string being formed by a series connection body of a plurality of resistor elements, and an output section having a common line to which outputs of a plurality of said transistors connected to alternate connection nodes between said resistor elements are connected and another common line to which outputs of a plurality of said transistors connected to other connection nodes are connected, said output section outputting reference voltages for another converting section from the two common lines.

7. The digital-to-analog converter according to claim 1, wherein each of said plurality of transistors includes a plurality of gate electrodes, and a semiconductor channel layer in which conduction between one end part on an input side and another end part on an output side is enabled by each local channel that occurs by being electrically coupled with each of said plurality of gate electrodes.

8. The digital-to-analog converter according to claim 1, wherein said predetermined code is Gray code.

9. A digital-to-analog converter comprising a converting section configured to convert all or a part of a bit width other than a bit width on a lowest order side included in a total bit width of an input digital signal into an analog value wherein said converting section includes a code converting section configured to convert a code of said digital signal into a predetermined code of a sequence in which a bit change between successive unit codes occurs at one digit position, and output each unit code of said predetermined code in parallel from a plurality of control lines, a reference voltage generating section configured to generate a plurality of reference voltages, a plurality of transistors disposed for said reference voltages, respectively, said plurality of transistors controlling output of the corresponding reference voltages, and a plurality of gate electrodes disposed for each of channels of said plurality of transistors, each gate electrode performing control to turn on and off a local channel, and the sequence of said predetermined code is programmed in said plurality of transistors by combinations of connections and disconnections between said gate electrodes and said control lines, and as an exception of the programming, a part of said transistor corresponding to a bit change position within a digit code inputted to each of said control lines is formed such that said local channel in the part of said transistor is on irrespective of a logical value indicated by said digit code.

10. A video display device comprising:

a pixel section in which pixels are arranged in a form of an array;

a plurality of signal lines disposed for pixel columns, respectively, of said pixel section;

one resistor string for generating a plurality of reference voltages having different values when a maximum voltage and a minimum voltage are applied to both ends of said resistor string, said resistor string being formed by a series connection body of a plurality of resistor elements; and a plurality of converting sections configured to convert a digital video signal inputted to the converting sections into an analog signal to be outputted to said signal lines, said converting sections being disposed for said signal lines, respectively;

wherein a part within said converting sections, the part converting all or a part of a bit width other than a bit width on a lowest order side included in a total bit width of said video signal into an analog value, includes a code converting section configured to convert a code of said digital signal into a predetermined code of a sequence in which a bit change between successive unit codes occurs at one digit position, and output the predetermined code from a plurality of control lines, a plurality of transistors disposed for said reference voltages, respectively, said plurality of transistors controlling output of the corresponding reference voltages, and a plurality of gate electrodes disposed for each of channels of said plurality of transistors, each gate electrode performing control to turn on and off a local channel, the sequence of said predetermined code is programmed in said plurality of transistors by combinations of connections and disconnections between said gate electrodes and said control lines, and in each of said plurality of transistors or each of the transistors excluding one or both of two transistors outputting a maximum reference voltage and a minimum reference voltage among said plurality of transistors, said gate electrode is omitted at a part corresponding to a digit where a bit change occurs between a unit code corresponding to said transistor and an adjacent unit code on one of an upper side and a lower side.

11. A video display device comprising:

a pixel section in which pixels are arranged in a form of an array;

a plurality of signal lines disposed for pixel columns, respectively, of said pixel section;

one resistor string configured to generate a plurality of reference voltages having different values when a maximum voltage and a minimum voltage are applied to both ends of said resistor string, said resistor string being formed by a series connection body of a plurality of resistor elements; and a plurality of converting sections configured to convert a digital video signal inputted to the converting sections into an analog signal to be outputted to said signal lines, said converting sections being disposed for said signal lines, respectively;

wherein a part within said converting sections, the part converting all or a part of a bit width other than a bit width on a lowest order side included in a total bit width of said video signal into an analog value, includes a code converting section configured to convert a code of said digital signal into a predetermined code of a sequence in which a bit change between successive unit codes occurs at one digit position, and output each unit code of said predetermined code in parallel from a plurality of control lines provided as pairs of positive logic lines and negative logic lines, a plurality of transistors disposed for said reference voltages, respectively, said plurality of transistors controlling output of the corresponding reference voltages, and a plurality of gate electrodes disposed for each of channels of said plurality of transistors, each gate electrode performing control to turn on and off a local channel, the sequence of said predetermined code is programmed in said plurality of transistors by combinations of connections of said gate electrodes to positive logic sides and negative logic sides of control line pairs, and in each of said plurality of transistors or each of the transistors excluding one or both of two transistors outputting a maximum reference voltage and a minimum reference voltage among said plurality of transistors, said gate electrode at a part corresponding to a digit where a bit change occurs between a unit code corresponding to said transistor and an adjacent unit code on one of an upper side and a lower side is connected to a voltage supplying line for turning on a local channel corresponding to said gate electrode at all times and is disconnected from both a positive logic control line and a negative logic control line.

* * * * *